United States Patent
Byars

(10) Patent No.: US 8,998,063 B2
(45) Date of Patent: Apr. 7, 2015

(54) WIRE LOOP FORMING SYSTEMS AND METHODS OF USING THE SAME

(71) Applicant: Orthodyne Electronics Corporation, Irvine, CA (US)

(72) Inventor: Jonathan Michael Byars, Fountain Valley, CA (US)

(73) Assignee: Orthodyne Electronics Corporation, Irvine, CA (US)

(*) Notice: Subject to any disclaimer, the term of this patent is extended or adjusted under 35 U.S.C. 154(b) by 0 days.

(21) Appl. No.: 13/746,489

(22) Filed: Jan. 22, 2013

(65) Prior Publication Data

US 2013/0200134 A1    Aug. 8, 2013

Related U.S. Application Data

(60) Provisional application No. 61/596,145, filed on Feb. 7, 2012.

(51) Int. Cl.
| | | |
|---|---|---|
| *H01L 23/48* | (2006.01) | |
| *B23K 31/02* | (2006.01) | |
| *H01L 21/67* | (2006.01) | |
| *B23K 35/00* | (2006.01) | |
| *H01L 23/00* | (2006.01) | |
| *B23K 20/00* | (2006.01) | |

(52) U.S. Cl.
CPC .......... *H01L 21/67138* (2013.01); *B23K 35/00* (2013.01); *H01L 24/78* (2013.01); *H01L 24/85* (2013.01); *B23K 20/004* (2013.01); *H01L 2224/48456* (2013.01); *H01L 2224/48472* (2013.01); *H01L 2224/45147* (2013.01); *H01L 2224/78* (2013.01); *H01L 2224/85* (2013.01); *Y10S 228/904* (2013.01)

(58) Field of Classification Search
CPC ..................................................... H01L 2224/04
USPC ....................................... 228/4.5, 180.5, 904
See application file for complete search history.

(56) References Cited

U.S. PATENT DOCUMENTS

| | | | | |
|---|---|---|---|---|
| 3,218,702 | A * | 11/1965 | Steudler | 228/115 |
| 4,527,730 | A * | 7/1985 | Shirai et al. | 228/180.5 |
| 4,925,085 | A * | 5/1990 | Buxton | 228/180.5 |
| 5,054,194 | A * | 10/1991 | Pollock | 29/840 |
| 5,277,355 | A * | 1/1994 | Weaver et al. | 228/4.5 |
| 5,395,038 | A * | 3/1995 | Olson et al. | 228/180.5 |
| 5,452,841 | A | 9/1995 | Sibata et al. | |
| 7,464,854 | B2 * | 12/2008 | Babinetz | 228/180.5 |
| 7,748,599 | B2 * | 7/2010 | Arahata et al. | 228/180.5 |
| 8,434,669 | B1 * | 5/2013 | Cheng et al. | 228/180.5 |
| 2009/0127316 | A1 | 5/2009 | Siepe | |

FOREIGN PATENT DOCUMENTS

| | | |
|---|---|---|
| JP | 58-192688 | 11/1983 |
| JP | 58192688 A  * | 11/1983 |

* cited by examiner

*Primary Examiner* — Devang R Patel
(74) *Attorney, Agent, or Firm* — Stradley Konon Stevens & Young, LLP

(57) ABSTRACT

A wire bonding system is provided. The system includes a bond head, a bonding tool carried by the bond head, a wire supply configured for bonding by the bonding tool, and a wire shaping tool carried by the bond head. The wire shaping tool is independently moveable with respect to the bond head and the bonding tool.

17 Claims, 6 Drawing Sheets

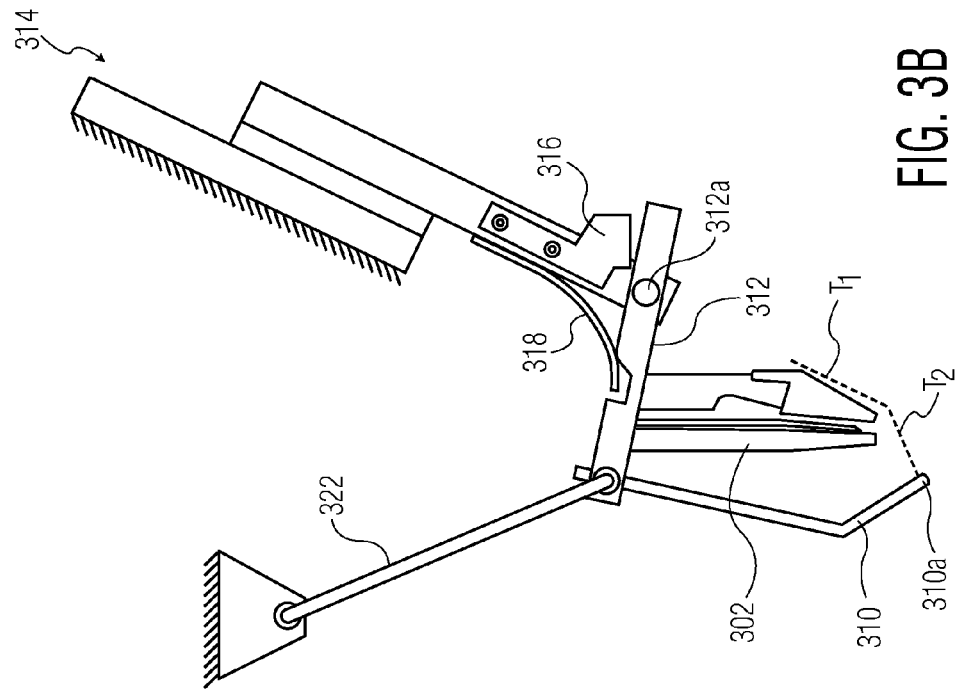
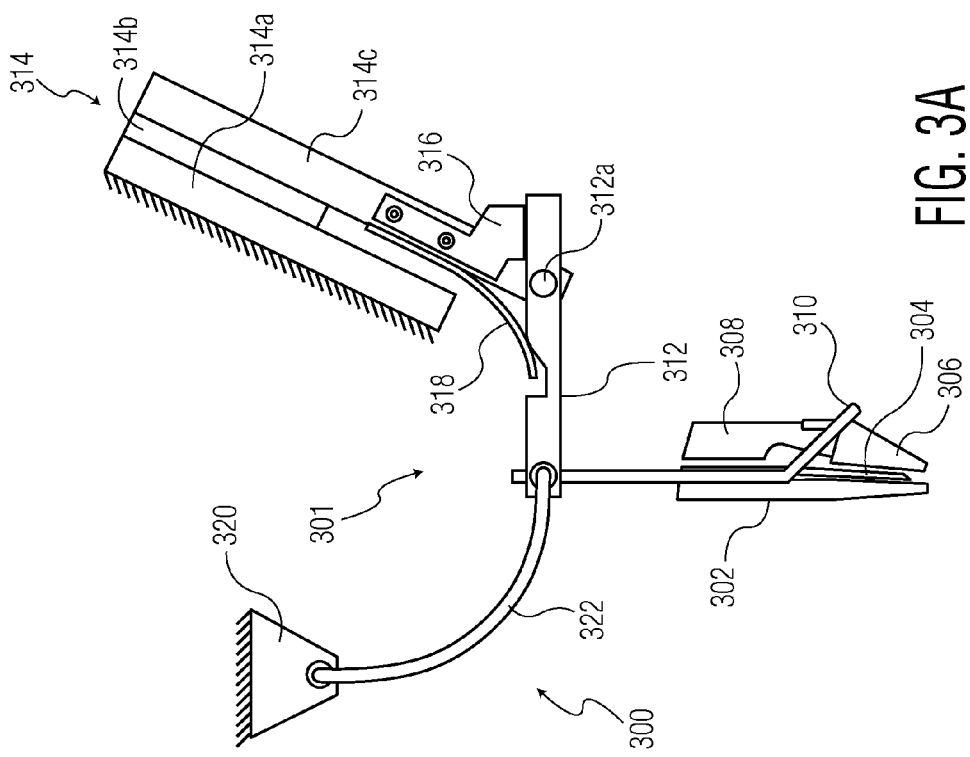

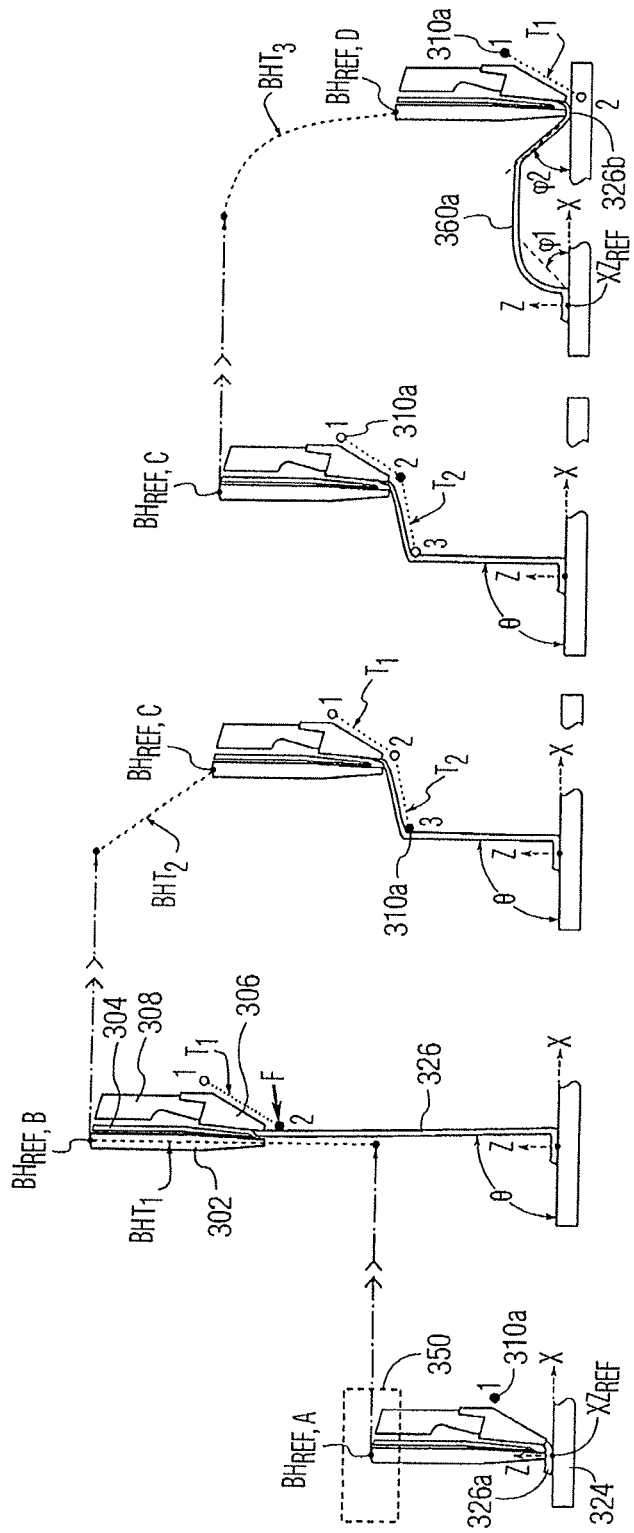

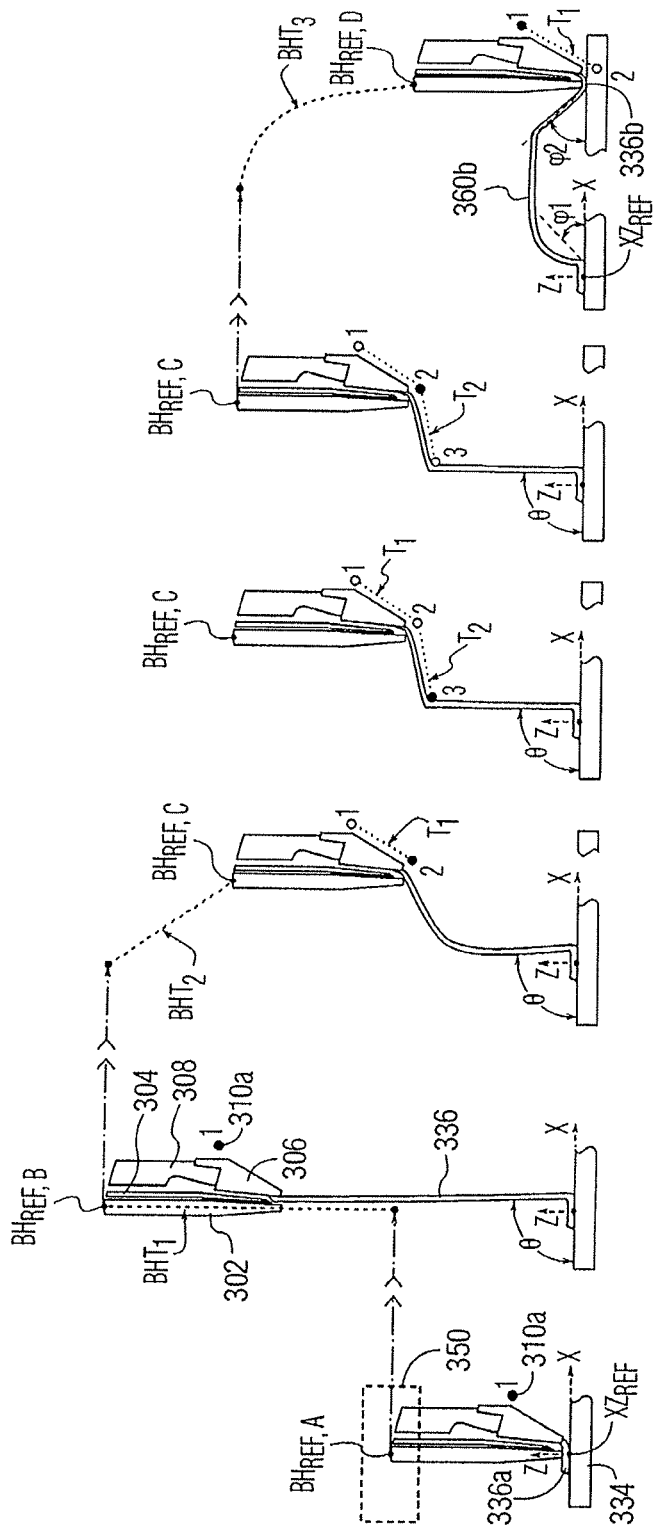

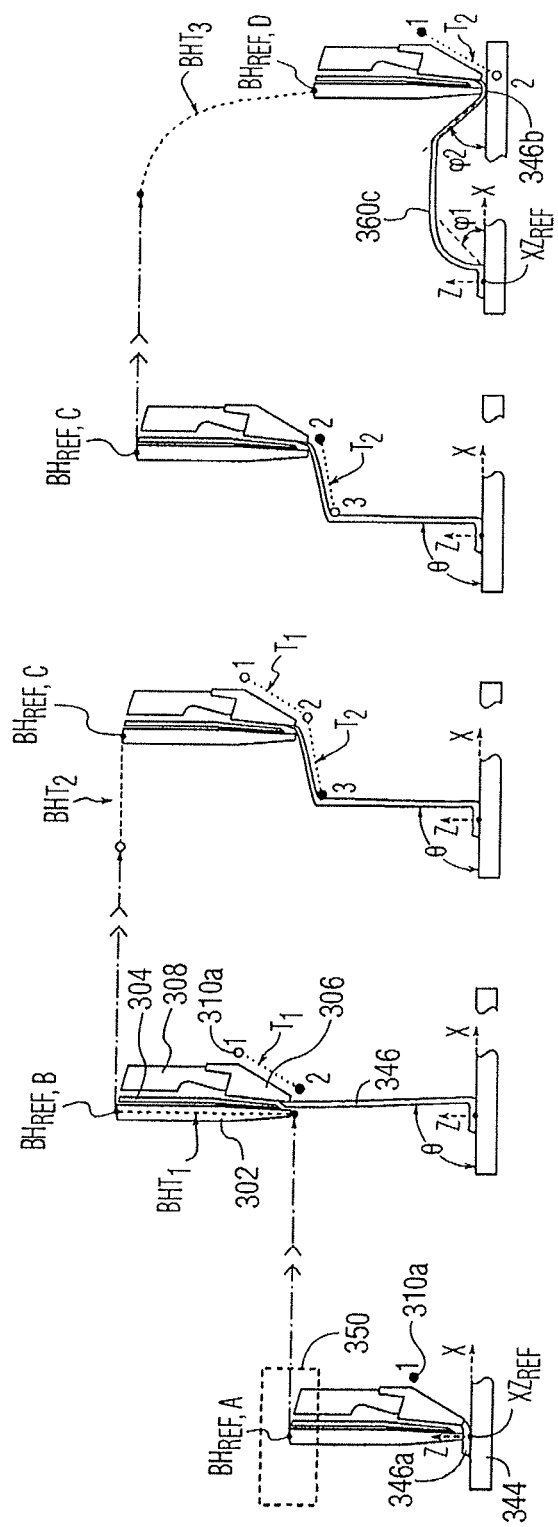

WIRE LOOP FORMING SYSTEMS AND METHODS OF USING THE SAME

CROSS-REFERENCE TO RELATED APPLICATION

This application claims the benefit of U.S. Provisional Application No. 61/596,145, filed Feb. 7, 2012, the contents of which are incorporated herein by reference.

FIELD OF THE INVENTION

The present invention relates to wire bonding operations, and more particularly, to systems and methods for shaping wire loops in connection with wire bonding operations.

BACKGROUND OF THE INVENTION

In the processing and packaging of semiconductor devices, ultrasonic bonding (e.g., wire bonding, ribbon bonding, etc.) continues to be a widely used method of providing electrical interconnection between two locations within a package (e.g., between locations in a semiconductor package, between locations in a power module, etc.). The electrical connections between the locations are typically referred to as wire loops. In many wire looping applications it is desirable to form wire loops having certain shapes and characteristics. In certain conventional wire bonding systems, a wire loop shaping tool is provided for contacting the wire loop during formation to affect the shape of the wire loop. JP58-192688 is an example of such a conventional system.

However, conventional systems including such a wire loop shaping tool suffer from certain deficiencies. For example, conventional wire loop shaping tools are typically mechanically adjusted, and as such, only a single type of wire loop may be formed using the wire loop shaping tool between mechanical adjustments. This is not desirable in certain applications (e.g., where there may be multiple different wire loop shapes in a given package). Thus, it would be desirable to provide improved wire bonding systems including wire loop shaping tools.

SUMMARY OF THE INVENTION

According to an exemplary embodiment of the present invention, a wire bonding system is provided. The system includes a bond head, a bonding tool carried by the bond head, a wire supply configured for bonding by the bonding tool, and a wire shaping tool carried by the bond head. The wire shaping tool is independently moveable with respect to the bond head and the bonding tool.

According to another exemplary embodiment of the present invention, a method of forming a wire loop is provided. The method includes the steps of: (1) bonding a first portion of a wire from a wire supply to a first bonding location of a substrate using a wire bonding tool carried by a bond head; (2) extending the wire from the first bonding location to an elevated position above the first bonding location; (3) shaping a second portion of the wire proximate the elevated position to form a bend using a wire shaping tool carried by the bond head and moveable with respect to the bond head and the wire bonding tool; (4) extending the wire to a second bonding location of the substrate; and (5) bonding a third portion of the wire to the second bonding location using the wire bonding tool. As will be appreciated by those skilled in the art, the elevated position does not need to be directly above the first bonding location. Further, the shaping at step (3) may not occur at the elevated position; that is, the shaping may be performed proximate the elevated position which is intended to refer to any position above the substrate. The shaping at step (3) may include, for example, forming a bend, kink, etc. in the wire.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 3A-3B are block diagrams illustrating operation of a wire bonding system in accordance with an exemplary embodiment of the present invention;

FIGS. 4A-4E are a series of block diagram views illustrating a method of forming a wire loop in accordance with an exemplary embodiment of the present invention;

FIGS. 5A-5F are a series of block diagram views illustrating a method of forming a wire loop in accordance with another exemplary embodiment of the present invention; and FIGS. 6A-6E are a series of block diagram views illustrating a method of forming a wire loop in accordance with yet another exemplary embodiment of the present invention.

DETAILED DESCRIPTION OF THE INVENTION

Figure 1A:
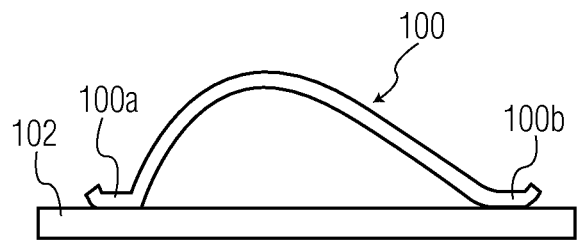
FIG. 1A is a side block diagram illustration of a conventional wire loop.

According to certain exemplary embodiments of the present invention, a loop forming mechanism is provided that is carried by (e.g., is attached to, directly or indirectly) the bond head of a wire bonding machine and is independently moveable with respect to the bond head. In certain applications, the loop forming mechanism allows for the manipulation of the wire loops to achieve substantially flat loop tops. Such manipulation may be accomplished, for example, using software features (e.g., computer program software features in a computer of a wire bonding machine) including a programmable height and a programmable step-back distance. Further, a location of a bend(s) of a wire loop may be programmed, using computer program instructions, to be at a contact point between a length of wire and the loop forming mechanism. The programmable nature of the loop forming mechanism may be used to allow wire bonding system users to create wire loops having programmable controlled loop geometries. Conventional wire loop shaping tools (such as described in JP58-192688) are controlled by mechanical adjustments to the wire loop shaping tool mechanism itself, and as such, those wire loop shaping tools do not allow for programmable control of loop heights or loop shapes using the wire loop shaping tool (e.g., the forming mechanism). By using a programmable controlled system as described herein, multiple wire geometries and/or multiple wire loop shapes may be achieved on a single machine in a single process program without the need to adjust mechanical parts. Thus, a more time efficient and cost efficient wire bonding operation is provided.

The terms "wire shaping tool" and "forming probe" are used interchangeably throughout this application. For example, FIGS. 3A-3B illustrate loop forming mechanism 301 including forming probe 310 having contact portion 310a. Forming probe 310 may also be referred to as wire shaping tool 310. Of course, alternative structures for element 310 (as well as other portions of mechanism 301) are contemplated within the scope of the present invention. Motion of the forming probe 310, particularly contact portion 310a, may be controlled according to a computer program. The computer program control of this motion may include force control (e.g., force applied to contact portion 310a), velocity control (e.g., velocity at which contact portion 310a moves), position control (e.g., controlling the position of contact portion 310a), etc.

Referring now to FIG. 1A, a conventional wire loop 100 is shown providing electrical interconnection between two locations of workpiece 102 (e.g., substrate 102). More specifically, first bond 100a is bonded (e.g., ultrasonically bonded) to a first bond location of workpiece 102, second bond 100b is bonded to a second bond location of workpiece 102, and a continuous span of wire included in wire loop 100 is provided between first bond 100a and second bond 100b. In the present application workpiece 102 is illustrated in a simplified form; however it is understood that workpiece 102 (and all other workpieces illustrated herein, which may also be referred to as substrates) may be any type of structure desiring electrical interconnection using a wire loop (e.g., a semiconductor package, a power module, an automotive module, a solar cell interconnection, etc.). Further, the term wire loop refers to a structure that may be formed using wire having a round cross section, a rectangular cross section (e.g., conductive ribbon), etc.

Figure 1B:
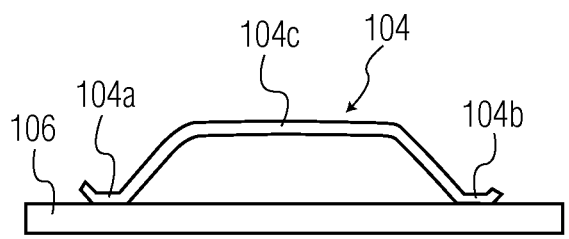
FIG. 1B is a side block diagram illustration of a wire loop formed using a wire bonding system in accordance with an exemplary embodiment of the present invention.

In contrast to the arc-shaped wire loop 100 shown in FIG. 1A, it may be desired to provide a wire loop having a substantially flat top loop shape such as wire loop 104 shown in FIG. 1B. More specifically, FIG. 1B illustrates: first bond 104a bonded to a first bond location of workpiece 106; second bond 104b bonded to a second bond location of workpiece 106; and a continuous span of wire included in wire loop 104 is provided between first bond 104a and second bond 104b. The span of wire between first bond 104a and second bond 104b includes a substantially flat portion 104c that may be formed using the systems, structures, and techniques described herein.

Figure 2:
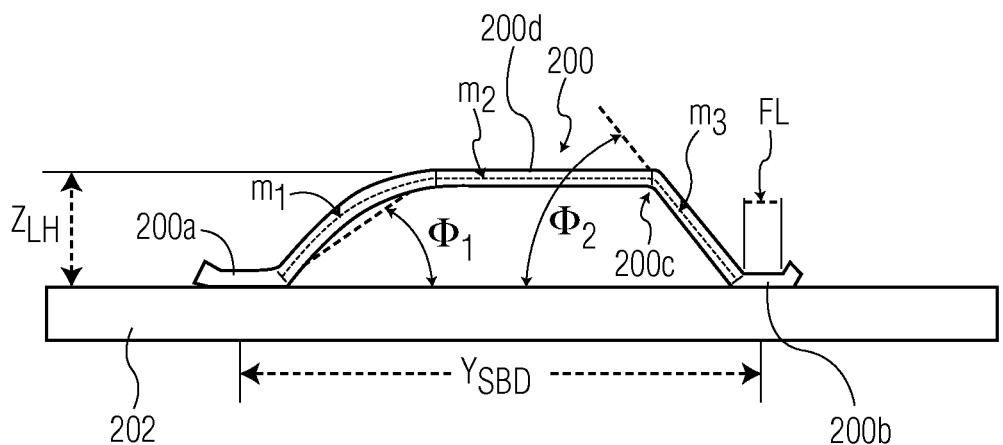
FIG. 2 is a side block diagram illustration of another wire loop formed using a wire bonding system in accordance with an exemplary embodiment of the present invention.

FIG. 2 illustrates another wire loop 200 providing interconnection on workpiece 202, where wire loop 200 includes first bond 200a, second bond 200b, and a length of wire therebetween. Wire loop 200 is partially defined by bend/kink 200c (where such bend/kink 200c may be formed using a wire shaping tool according to the present invention). Wire bond process outputs illustrated in FIG. 2 include: a predictable and programmable loop height ($Z_{LH}$); first wire length ($m_1$); a second, substantially flat wire length/span ($m_2$)—also labeled as portion 200d; third wire length ($m_3$); loop angles ($\phi1$ and $\phi2$); step-back distance ($Y_{SBD}$) which is the distance between a center of first bond 200a and a center of second bond 200b; and foot length (FL) which is a portion of the wire loop bonded to a bonding location where the length of this portion is related to the length of the bonding tool forming the bond. In certain applications it is desired to achieve variations in loop height ($Z_{LH}$) while maintaining a substantially flat span ($m_2$) and having maximum loops angles ($\phi1$ and $\phi2$)—and this can be achieved by programmatically controlling length ($m_3$) and/or the location of bend 200c.

Figure 3C:
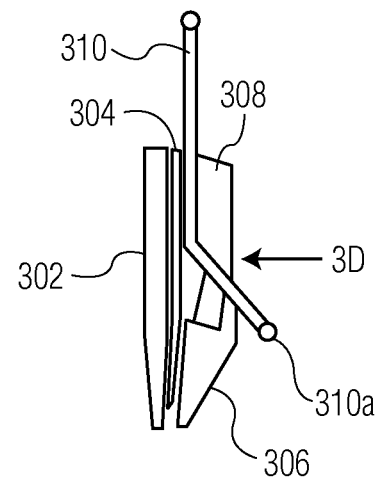
FIGS. 3C-3D are block diagrams illustrating views of certain of the elements of the wire bonding system of FIGS. 3A-3B.
Figure 3D:
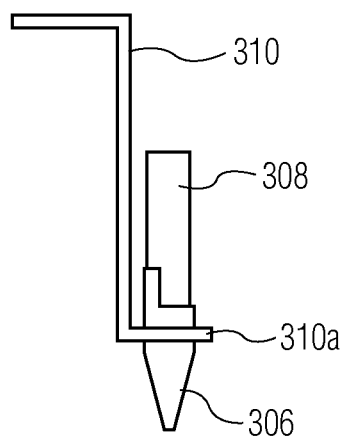

FIG. 3A illustrates elements of an exemplary wire bonding system 300. Many of the elements of system 300 are removed for simplicity, for example, the bond head of system 300 is not specifically shown but is represented by elements that the bond head carries. System 300 includes a number of elements carried by the bond head including bonding tool 302 (e.g., a wedge bonding tool, a ribbon bonding tool, etc.), cutter 304, wire guide 306, and wire guide holder 308. Also shown in FIG. 3A are exemplary elements of a loop forming mechanism 301 (also known as a loop shaping mechanism), which elements are also carried by the bond head. As will be appreciated by those skilled in the art, in the example shown in FIG. 3A, bonding tool 302, cutter 304, wire guide 306, and wire guide holder 308 are in the background in comparison to the illustrated elements of loop forming mechanism 301 (which are in the foreground in FIG. 3A), and are not engaged with loop forming mechanism other than all being carried by the bond head. The exemplary loop forming mechanism 301 includes forming probe 310 (also known as wire shaping tool 310 or shaping probe 310) that is rigidly attached to lever arm 312. Lever arm 312 is affixed to linearly actuated push rod 314c (of probe driver 314) through pivot point 312a. Push rod 314c is attached to bearing block 314b of probe driver 314 that is actuated by a motor or other driving system (e.g., a linear motor), not shown. Bearing block 314b rides along linear slide 314a of probe driver 314. Loop forming mechanism 301 also includes cable 322 disposed between lever arm 312 (e.g., through a pivot point) and structure 320 (where structure 320 is attached to, or a part of, the bond head). Elements 310, 312, 314 (including elements 314a, 314b, and 314c), 316, 318, 320, and 322 may be considered to be part of exemplary loop forming mechanism 301 illustrated in FIGS. 3A-3B. The orientation of loop forming mechanism 301 in FIG. 3A is an "at rest" position where forming probe 310 is not in contact with the wire (where the wire is not shown). FIG. 3C is a simplified view of certain elements shown in FIG. 3A including forming probe 310 in the same at rest position, and FIG. 3D illustrates the same elements but rotated 90 degrees. Stated differently, if a person looks at the elements of FIG. 3C from direction "3D" shown in FIG. 3C, then the person would see what is shown in FIG. 3D. FIG. 3D illustrates contact portion 310a of forming probe 310. Contact portion 310a is the portion of forming probe 310 that is configured to contact and shape a portion of wire.

At the point in time when a user desires to form or otherwise shape (e.g., form a bend, kink, etc.) a portion of wire, forming probe 310 is driven by probe driver 314. In FIG. 3B the motion of contact portion 310a of forming probe 310 is shown in two trajectories (i.e., trajectory $T_1$ and trajectory $T_2$). Specifically, lever spring 318 (which may be replaced by a torsion spring, compression spring, extension spring, or others) forces lever arm 312 to rest against hard-stop 316 when forming probe 310 is actuated along trajectory $T_1$ (e.g., see FIG. 3B) by the action of a motor (e.g., a linear motor, not shown) of probe driver 314. At a transition point in the linear stroke, cable 322 pulls taut with tension (e.g., see tensioned cable 322 in FIG. 3B), thereby forcing lever arm 312 to pivot about pivot point 312a which causes forming probe 310 to follow trajectory $T_2$. The dual trajectory (e.g., a linear motion along trajectory $T_1$, and a pivotal motion about pivot point 312a combined with a linear motion resulting in approximately linear motion during trajectory $T_2$) allows forming probe 310 to rest in a position that maximizes clearance around bonding tool 302 when not in use (see the at rest position in FIG. 3A) while still allowing for the second trajectory to affect the wire loop in the desired manner.

As will be appreciated by those skilled in the art, the elements of loop forming mechanism 301 are exemplary in nature. Alternative elements and arrangements are contemplated. Operation of the elements of loop forming mechanism 301 may vary as desired in a given application. FIGS. 4A-4E, 5A-5F, and 6A-6E illustrate exemplary techniques for operating loop forming mechanism 301 to form/shape a wire loop in connection with a wire looping process. Of course, these processes are examples and alternatives are contemplated. In each of FIGS. 4A-4E, 5A-5F, and 6A-6E, certain of the elements shown in FIGS. 3A-3B are removed for simplicity. Further, only a cross section view of contact portion 310a of forming probe 310 is shown—the remainder of forming probe 310 (and loop forming mechanism 301) is omitted for simplicity.

In each of FIGS. 4A-4E, FIGS. 5A-5F, and FIGS. 6A-6E: a reference position on the workpiece/substrate is labeled $XZ_{REF}$; and a reference location on bond head 350 (used for illustrating movement of bond head 350 to, for example, positions A, B, C, D, and E in the XZ plane) is labeled $BH_{REF}$. Of course these reference positions/locations are arbitrary and are for illustrative purposes only.

FIGS. 4A-4E illustrate a "force control" mode of operating loop forming mechanism 301 (illustrated through the movement of contact portion 310a of forming probe 310). At FIG. 4A, first bond 326a is formed by bonding (e.g., ultrasonically bonding, thermosonically bonding, etc.) a portion of wire 326 to a bonding location of workpiece 324. During the formation of first bond 326a in FIG. 4A, bond head 350 is illustrated at position A with respect to the position $XZ_{REF}$ (i.e., $BH_{REF}$ is shown at position A), and contact portion 310a of forming probe 310 is illustrated at position 1 (i.e., the at rest position) with respect to location $BH_{REF}$ of the bond head. Then, at FIG. 4B bond head 350 (illustrated as elements it carries including bonding tool 302, cutter 304, wire guide 306, wire guide holder 308, and loop forming mechanism 301) has been raised along trajectory $BH_1$ (i.e., bond head trajectory 1), for example, to a "top of loop" position while drawing wire 326 through wire guide 306 (e.g., with the wire clamps open). As such, $BH_{REF}$ is now at position B with respect to the $XZ_{REF}$. Contact portion 310a of forming probe 310 is also moved from position 1 (e.g., an at rest position) to position 2 (e.g., a force transition position) with respect to location $BH_{REF}$ of bond head 350. For example, and as shown in FIG. 4B, forming probe 310 has been actuated (e.g., where an example of such actuation is described in connection with FIGS. 3A-3B) such that contact portion 310a is brought to rest with a constant and/or programmable force F (thus the "force control" mode) against wire 326 at position 2. Thus, contact portion 310a has now moved with respect to bond head 350. This movement with respect to bond head 350 is illustrated in FIG. 4B as trajectory $T_1$. The movement of contact portion 310a from position 1 to position 2 may desirably be accomplished at least partially (if not fully) simultaneous with the movement of bond head 350 from position A to position B, thus decreasing the cycle time of the wire looping process. Movement of bond head 350 is stopped and the wire clamps (not shown, but which may be included in wire guide holder 308) are closed thus stopping additional wire from being fed through wire guide 306 in the remaining steps shown in FIGS. 4C-4E. As shown in FIG. 4C, bond head 350 is then moved a programmatically controlled distance along a downward angled trajectory $BHT_2$ (i.e., bond head trajectory 2, which includes both an X-axis and Z-axis component in this example) such that $BH_{REF}$ is now at position C with respect to the $XZ_{REF}$. During the movement of bond head 350 along trajectory $BHT_2$, contact portion 310a of forming probe 310 slides along wire 326 through trajectory $T_2$, where trajectory $T_2$ extends from position 2 to position 3. When contact portion 310a slides along wire 326 in connection with trajectory $T_2$, slack in wire 326 (e.g., caused by movement of bond head 350) is taken up, and wire 326 is kept taut (e.g., with tension) such that the application of programmable force F (which may desirably be held constant) causes a bend or kink in wire 326 that will define second bond angle ($\phi 2$) (e.g., see FIG. 4E).

As shown in FIG. 4D, contact portion 310a of forming probe 310 is then retracted back to position 2 (e.g., through servo position control) along trajectory $T_2$ while bond head 350 maintains it's location such that $BH_{REF}$ is still at position C with respect to $XZ_{REF}$. Then, as shown at FIG. 4E, bond head 350 has followed loop trajectory $BHT_3$ (i.e., bond head trajectory 3) to a second bond location (to form second bond 326b) such that $BH_{REF}$ is at position D with respect to $XZ_{REF}$. The specific geometric trajectory used for $BHT_3$ (which may be derived from an algorithm used to provide the desired final wire loop shape), as well a programmable wire angle θ, contribute to the magnitude of first bond angle $\phi 1$. Further, contact portion 310a of forming probe 310 moves back to position 1 along trajectory $T_1$, where such movement of contact portion 310a may be partially (or fully) simultaneous with the movement of bond head 350 to the second bond location. The formed wire loop 360a is then separated from the wire supply using, for example, cutter 304 and/or tearing of wire 326 by an upward motion of bond head 350.

The magnitude of the programmable force F may vary widely (e.g., over several orders of magnitude) depending on the wire size. Exemplary wire diameters may range between 5 mil and 20 mil. As will be appreciated by those skilled in the art, a 5 mil wire may utilize a relatively small programmable force F (e.g., 0.05N) compared to a 20 mil wire which may utilize a relatively large programmable force F (e.g., 5N). For copper wire/ribbon, an even greater programmable force F for a 20 mil wire (e.g., 10-15N) may be utilized. Of course, these force levels are exemplary in nature and may vary widely.

FIGS. 5A-5F illustrate an "impact control" mode of operating loop forming mechanism 301 (illustrated through the movement of contact portion 310a of forming probe 310). At FIG. 5A, first bond 336a is formed by bonding (e.g., ultrasonically bonding, thermosonically bonding, etc.) a portion of wire 336 to a bonding location of workpiece 334. During the formation of first bond 336a in FIG. 5A, bond head 350 is illustrated at position A with respect to the position $XZ_{REF}$ (i.e., $BH_{REF}$ is shown at position A), and contact portion 310a of forming probe 310 is illustrated at position 1 (i.e., the at rest position) with respect to location $BH_{REF}$ of the bond head. Then, at FIG. 5B bond head 350 (illustrated as elements it carries including bonding tool 302, cutter 304, wire guide 306, wire guide holder 308, and loop forming mechanism 301) has been raised along trajectory $BHT_1$ (i.e., bond head trajectory 1), for example, to a "top of loop" position while drawing wire 336 through wire guide 306 (e.g., with the wire clamp open). As such, $BH_{REF}$ is now at position B with respect to the $XZ_{REF}$. The bond head movement is stopped and the wire clamps (included in wire guide holder 308) are closed thus stopping additional wire from being fed through wire guide 306 in the remaining steps shown in FIGS. 5C-5F. As shown in FIG. 5C, bond head 350 is then moved a programmatically controlled distance along a downward angled trajectory $BHT_2$ (i.e., bond head trajectory 2) such that $BH_{REF}$ is now at position C with respect to the $XZ_{REF}$.

Because contact portion 310a is not in contact with wire 336 during this downward movement of bond head 350, the downward motion of bond head 350 causes slack in wire 336. Contact portion 310a of forming probe 310 is also moved from position 1 (e.g., an at rest position) to position 2 with respect to location $BH_{REF}$ of bond head 350 such that it reaches a programmable velocity as it passes through position 2. Thus, contact portion 310a has now moved with respect to bond head 350. This movement with respect to bond head 350 is illustrated in FIG. 5C as trajectory $T_1$. The movement of contact portion 310a from position 1 to position 2 may desirably be accomplished at least partially (if not fully) simultaneous with the movement of bond head 350 from position B to position C, thus decreasing the cycle time of the wire looping process.

As shown in FIG. 5D, forming tool 310 moves at a programmable velocity (e.g., a constant velocity) such that contact portion 310a of forming probe 310 moves along trajectory $T_2$ while bond head 350 maintains it's location ($BH_{REF}$ is at position C), where trajectory $T_2$ extends from position 2 to position 3. This movement from position 2 to position 3 may be at the same programmable velocity as contact portion 310a moves through position 2 (e.g., see FIG. 5C). The motion of contact portion 310a from position 2 to position 3 causes contact portion 310a to contact wire 336 along trajectory $T_2$ thereby taking up the slack of wire 336. The tightness of wire 336 then halts the motion of contact portion 310a and other mechanism components in motion (e.g., elements 312, 314, and 316) causing an impact force approximately proportional to the velocity of the mechanism components to be imparted to wire 336. The impact causes a bend or kink in wire 336 that will define second bond angle ($\phi2$) (e.g., see FIG. 5F). The actuation distance (the distance that contact portion 310a moves in trajectory $T_2$) is proportional to the amount of slack imparted into wire 336 by the programmatically controlled downward motion of bond head 350 along downward trajectory $BHT_2$ which is determined by the desired final loop height.

As shown in FIG. 5E, contact portion 310a of forming probe 310 is then retracted back to position 2 (e.g., through servo position control) along trajectory $T_2$ while bond head 350 maintains it's location such that $BH_{REF}$ is still at position C with respect to the $XZ_{REF}$. Then, as shown at FIG. 5F, bond head 350 follows loop trajectory $BHT_3$ (i.e., bond head trajectory 3) to a second bond location (to form second bond 336b) such that $BH_{REF}$ is at position D with respect to the $XZ_{REF}$. The specific geometric trajectory used for $BHT_3$ (which may be derived from an algorithm used to provide the desired final wire loop shape), as well a programmable wire angle θ, contribute to the magnitude of first bond angle $\phi1$. Further, contact portion 310a of forming probe 310 moves back to position 1 along trajectory $T_1$, where such movement of contact portion 310a may be at least partially (or fully) simultaneous with the movement of bond head 350 to the second bond location. The formed wire loop 360b is then separated from the wire supply using, for example, cutter 304 and/or tearing of wire 336 by an upward motion of bond head 350.

The magnitude of the velocity of contact portion 310a in FIGS. 5A-5F may vary widely. Exemplary ranges for the velocity include 20-500 mm/sec and 100-200 mm/sec. The velocity during trajectory $T_1$ of contact portion 310a may be the same, or different from the velocity during trajectory $T_2$. Further, the velocity during each trajectory $T_1$, $T_2$ may be a constant velocity or variable (e.g., incrementally changed).

Further still, the motion of contact portion 310a may be continuous from the start of trajectory $T_1$ until the end of trajectory $T_2$, if desired.

FIGS. 6A-6E illustrate a "position control" mode of operating loop forming mechanism 301 (illustrated through the movement of contact portion 310a of forming probe 310). At FIG. 6A, first bond 346a is formed by bonding (e.g., ultrasonically bonding, thermosonically bonding, etc.) a portion of wire 346 to a bonding location of workpiece 344. During the formation of first bond 346a in FIG. 6A, bond head 350 is illustrated at position A with respect to the position $XZ_{REF}$ (i.e., $BH_{REF}$ is shown at position A), and contact portion 310a of forming probe 310 is illustrated at position 1 (i.e., the at rest position) with respect to location $BH_{REF}$ of the bond head. Then, at FIG. 6B bond head 350 (illustrated as elements it carries including bonding tool 302, cutter 304, wire guide 306, wire guide holder 308, and loop forming mechanism 301) has been raised along trajectory $BHT_1$ (i.e., bond head trajectory 1), for example, to a "top of loop" position while drawing wire 346 through wire guide 306 (e.g., with the wire clamps open). As such, $BH_{REF}$ is now at position B with respect to the $XZ_{REF}$. Contact portion 310a of forming probe 310 is also moved from position 1 (e.g., the at rest position) to position 2 with respect to location $BH_{REF}$ of bond head 350. Thus, and as shown in FIG. 6B, forming probe 310 has been actuated (e.g., where an example of such actuation is described in connection with FIGS. 3A-3B) such that contact portion 310a has now moved with respect to bond head 350. This movement with respect to bond head 350 is illustrated in FIG. 6B as trajectory $T_1$. The movement of contact portion 310a from position 1 to position 2 may desirably be accomplished at least partially (if not fully) simultaneous with the movement of bond head 350 from position A to position B, thus decreasing the cycle time of the wire looping process.

As shown in FIG. 6C, forming tool 310 moves such that contact portion 310a of forming probe 310 moves along trajectory $T_2$ from position 2 to a programmable position 3. In this mode, the end position (e.g., position 3) of forming probe 310 is controlled to form/shape a bend/kink in resultant wire loop 360c that will define second bond angle ($\phi2$) (e.g., see FIG. 6E). Unlike the shaping in FIGS. 4C and 5D, the wire clamps (included in wire guide holder 308) in FIG. 6C are left open to allow more wire to be drawn out of wire guide 306 during the contact between wire 346 and contact portion 310a. Also shown in FIG. 6C is movement of bond head 350 along trajectory $BHT_2$ (i.e., bond head trajectory 2) which may desirably be at least partially (if not fully) simultaneous with the movement of contact portion 310a from position 2 to position 3. As such, $BH_{REF}$ is now at position C with respect to the $XZ_{REF}$.

As will be appreciated by those skilled in the art, actuation of contact portion 310a along trajectory $T_2$ is a controlled actuation distance to a programmable position (position 3) determined by the desired loop shape (hence "position control") to form/shape wire 346, thereby forming the desired (e.g., minimum) second bond angle at the wire span distance $m_3+FL$ (see FIG. 2).

Following the formation of the kink/bend in wire 346 (through the motion of contact portion 310a along trajectory $T_2$ in FIG. 6C), the wire clamps are closed and contact portion 310a of forming probe 310 is retracted to position 2 (along trajectory $T_2$) in FIG. 6D while bond head 350 maintains it's location such that $BH_{REF}$ is still at position C with respect to the $XZ_{REF}$. Then, as shown at FIG. 6E, bond head 350 has followed loop trajectory $BHT_3$ (i.e., bond head trajectory 3) to a second bond location (to form second bond 346b) such that $BH_{REF}$ is at position D with respect to the $XZ_{REF}$. The specific geometric trajectory used for BHT$_3$ (which may be derived from an algorithm used to provide the desired final wire loop shape), as well a programmable wire angle θ, contribute to the magnitude of first bond angle φ1. Further, contact portion 310a of forming probe 310 moves back to position 1 along trajectory T$_1$, where such movement of contact portion 310a may be at least partially (or fully) simultaneous with the movement of bond head 350 to the second bond location. The formed wire loop 360c is then separated from the wire supply using, for example, cutter 304 and/or tearing of wire 326 by an upward motion of bond head 350.

In certain exemplary embodiments of the present invention, feedback of a given parameter(s) may be used in the programmable manipulation of the loop shape. For example, in a position control mode (see FIGS. 6A-6E) the actual position of contact portion 310a of forming probe 310 may be provided as feedback to ensure proper wire loop forming/shaping. While such feedback may be particularly useful in the position control mode, feedback may also be provided in other modes such as force and impact control modes, with feedback being provided related to parameters such as velocity, acceleration, jerk, and force.

Thus, according to the present invention, various parameters may be controlled (e.g., force applied to the forming probe at the end of trajectory T$_2$, impact/velocity between the forming probe and the wire at the end of trajectory T$_2$, and the position of the forming probe at the end of trajectory T$_2$, amongst others) to provide the desired wire forming/shaping. It will be appreciated that different parameters may be used for different wire loops in a bonding program.

Throughout FIGS. 4A-4E, 5A-5F, and 6A-6E, a programmable wire angle θ is illustrated. This programmable wire angle θ is the angle between the wire above the first bond location and a horizontal axis of the workpiece. In each of these drawings programmable wire angle θ is shown as being approximately 90° (when θ is 90°, there is a 0° step-forward angle). As is known to those skilled in the art, a step-forward angle is the angular difference between the wire and a pure vertical axis. However, programmable wire angle θ may vary as desired to provide a non-zero step-forward angle. Exemplary ranges for programmable wire angle θ include: 40° to 135°; and 75° to 90°. A programmable wire angle θ of 75° would yield a 15° step-forward angle.

The length of trajectory T2 in each of the exemplary embodiments described herein may also be referred to as an actuation distance (AD). This length may vary considerably, with an exemplary range being between (a) 300 microns and (b) 12 mm.

As made clear above with respect to certain non-limiting examples, various steps of the methods described herein may be performed at least partially (if not fully) simultaneous with one another as opposed to completely separate in time from one another. Other examples are contemplated within the scope of the present invention.

Although the present invention has been described primarily with respect to contact portion 310a moving along 2 trajectories (i.e., trajectories T$_1$ and T$_2$) the present invention is not limited thereto. For example, one single trajectory may be used if practical (e.g., if a collision with bond head elements could be avoided). Conversely, three or more trajectories could be used. In one specific example, a 3 trajectory system could be used where a third purely vertical trajectory (or substantially vertical trajectory) could be added (in addition to trajectories T$_1$ and T$_2$) to provide extra vertical clearance from system elements (e.g., bond head elements).

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A wire bonding system, comprising:
a bond head;
a bonding tool carried by the bond head;
a wire supply configured for bonding by the bonding tool;
a wire shaping tool carried by the bond head, the wire shaping tool being independently moveable with respect to the bonding tool; and
a probe driver for driving the wire shaping tool, wherein the probe driver includes a lever arm attached to the wire shaping tool and affixed to a linearly actuated push rod.

2. The wire bonding system of claim 1 wherein the wire shaping tool is configured for multiple trajectory motions in relation to the bond head.

3. The wire bonding system of claim 2 wherein the wire shaping tool is configured for two trajectory motions in relation to the bond head.

4. The wire bonding system of claim 2 wherein at least one of the multiple trajectory motions causes the wire shaping tool to contact a portion of the wire supply.

5. The wire bonding system of claim 4 wherein the wire shaping tool imparts a bend in the wire supply during contact therebetween.

6. The wire bonding system of claim 5 wherein the imparted bend in the wire supply becomes a second bend in a wire loop proximate a second bonded portion of the wire supply.

7. The wire bonding system of claim 1 wherein the wire shaping tool is controlled according to at least one computer program.

8. The wire bonding system of claim 7 wherein the at least one computer program is configured to provide a desired bend in a wire loop at a point of contact between the wire shaping tool and the wire supply.

9. The wire bonding system of claim 7 wherein the at least one computer program includes computer program instructions to provide one of a plurality of desired bends in a we loop at a point of contact between the wire shaping tool and the wire supply.

10. The wire bonding system of claim 1 wherein at least a portion of the independent movement of the wire shaping tool with respect to the bonding tool is a pivotal movement.

11. The wire bonding system of claim 1 wherein the wire shaping tool is part of a loop forming mechanism of the wire bonding system, the loop forming mechanism including a driving system for providing the independent movement of the wire shaping tool through the probe driver.

12. The wire bonding system of claim 11 wherein the driving system is a linear motor that provides the independent movement of the wire shaping tool.

13. The wire bonding system of claim 1 wherein the wire bonding system is adapted to apply a predetermined force to a portion of the wire supply using the wire shaping tool.

14. The wire bonding system of claim 13 wherein the wire bonding system includes a computer including computer program instructions to apply the predetermined force.

15. The wire bonding system of claim 1 wherein the wire bonding system is adapted to contact a portion of the wire supply using the wire shaping tool moving at a predetermined velocity.

16. The wire bonding system of claim 15 wherein the wire bonding system includes a computer including computer program instructions to move the wire shaping tool at the predetermined velocity.

17. The wire bonding system of claim 1 further comprising a wire guide carried by the bond head.

* * * * *

UNITED STATES PATENT AND TRADEMARK OFFICE
CERTIFICATE OF CORRECTION

| | | |
|---|---|---|
| PATENT NO. | : 8,998,063 B2 | Page 1 of 1 |
| APPLICATION NO. | : 13/746489 | |
| DATED | : April 7, 2015 | |
| INVENTOR(S) | : Jonathan M. Byars | |

It is certified that error appears in the above-identified patent and that said Letters Patent is hereby corrected as shown below:

On Title Page:
        Item (74) should read:
            Stradley Ronon Stevens & Young, LLP Signed and Sealed this
Eighth Day of September, 2015

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 8,998,063 B2 | Page 1 of 1 |
| APPLICATION NO. | : 13/746489 | |
| DATED | : April 7, 2015 | |
| INVENTOR(S) | : Jonathan M. Byars | |

It is certified that error appears in the above-identified patent and that said Letters Patent is hereby corrected as shown below:

In the claims

In claim 9, at column 10, line 44 should read:
tions to provide one of a plurality of desired bends in a wire Signed and Sealed this
Fifth Day of January, 2016

Michelle K. Lee
*Director of the United States Patent and Trademark Office*